United States Patent
Vogley

(10) Patent No.: US 6,223,264 B1
(45) Date of Patent: Apr. 24, 2001

(54) SYNCHRONOUS DYNAMIC RANDOM ACCESS MEMORY AND DATA PROCESSING SYSTEM USING AN ADDRESS SELECT SIGNAL

(75) Inventor: Wilbur Christian Vogley, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/262,161

(22) Filed: Jun. 17, 1994

Related U.S. Application Data

(63) Continuation of application No. 07/783,436, filed on Oct. 24, 1991, now abandoned.

(51) Int. Cl.[7] .............................. G06F 13/00; G06F 1/04; G11C 11/407
(52) U.S. Cl. .......................... 711/167; 711/104; 713/500; 713/600; 365/233
(58) Field of Search .................................... 395/425, 800; 711/104, 105, 167; 365/193, 233; 713/500, 600

(56) References Cited

U.S. PATENT DOCUMENTS

| | | | |
|---|---|---|---|
| 3,631,404 | * 12/1971 | Bernhardt et al. | 711/220 |
| 3,702,463 | * 11/1972 | Lesniewski | 713/600 |
| 4,608,678 | 8/1986 | Threewitt | 365/189.02 |
| 4,649,511 | 3/1987 | Gdula | 711/106 |
| 4,698,749 | * 10/1987 | Bhadriraju | 711/104 |
| 5,014,188 | * 5/1991 | Kawamura | 711/3 |
| 5,021,951 | * 6/1991 | Baba | 711/201 |
| 5,077,693 | 12/1991 | Hardee et al. | 365/230.08 |
| 5,093,807 | 3/1992 | Hashimoto et al. | 365/230.09 |
| 5,097,437 | * 3/1992 | Larson | 712/245 |
| 5,179,670 | 1/1993 | Farmwald et al. | 710/102 |
| 5,226,011 | 7/1993 | Yanagisawa | 365/189.05 |
| 5,243,703 | 9/1993 | Farmwald et al. | 713/400 |
| 5,268,865 | * 12/1993 | Takasugi | 365/189.05 |
| 5,291,580 | * 3/1994 | Bowden, III et al. | 711/105 |
| 5,390,149 | * 2/1995 | Vogley et al. | 365/189.01 |
| 5,479,635 | * 12/1995 | Kametani | 711/105 |
| 5,587,954 | * 12/1996 | Vogley et al. | 365/221 |

FOREIGN PATENT DOCUMENTS 59-56276   3/1984   (JP).

OTHER PUBLICATIONS

*IEEE 1990 Cust. IC Conference,* Ed Reese et al, "A Sub–10nS Cache SRAM for High Performance 32 Bit Microprocessors," pp. 24.2 1–24.2.4.

*Computer Design,* Ron Wilson, "Will the Search for the Ideal Memory Architcture Ever End?", pp. 78–99, Jul. 1, 1990.

*Semiconductor Memories,* Charles Hochstedler, "SelfTimed SRAMs Pace High–Speed ECL Processors," pp. 4–10, 1990.

(List continued on next page.)

Primary Examiner—Glenn Gossage
(74) Attorney, Agent, or Firm—Robert N. Rountree; Lawrence J. Bassuk; Richard L. Donaldson

(57) ABSTRACT

A data processing system (15) including a synchronous random access memory (30) and a method for accessing the synchronous random access memory are disclosed. A digital processor (20) of the data processing system is arranged with a system clock circuit (65) that produces a system clock signal for controlling operation of the digital processor. Addressable storage cells within the synchronous random access memory are accessed in response to the system clock signal and a single select signal such as an address select signal (ADS) to write data into the storage cells or read data out from the storage cells. The synchronous random access memory device may be fabricated as a dynamic storage device or as a static storage device.

22 Claims, 3 Drawing Sheets

OTHER PUBLICATIONS

*Electronics*, J. Robert Lineback, "System Snags Shouldn't Slow the Boom in Fast Static RAMS," pp. 60–62, Jul. 23, 1987.

*END*, Triad Semiconductors Inc, "Static RAMs have on–chip address and data latches for Pipelining," p. 116, Dec. 8, 1988.

Electronics, Bernard C. Cole, "Motorola's Radical SRAM Design Speeds Systems 40%," Jul. 23, 1987 pp. 66–68.

*Electronic Design*, Mohammad Shakaib Iqbal, "Internally Timed RAMs Build Fast Writable Control Stores," pp. 93–96, Aug. 25, 1988.

*EDN*, Steven Leibson, "SRAMs' On–Chip Address and Data Latches Boost Throughput in Pipelined Systems," pp. 102, 104, Oct. 13, 1988.

*EDN*, John Gallant, "Special–feature SRAMs," pp. 104–112, Jun. 20, 1991.

*Electronics*, Samuel Weber, Specialty SRAMs Are Filling the Speed Gap, pp. 85–87, May 1990.

*Proc. IEEE 1987 Custom Integrated Circuits Conference*, M. Hashimoto et al, "A 20 ns 256K×4 Fifo Memory," pp. 315–318, May 4–7, 1987.

*IEEE Journal of Solid–State Circuits*, M. Hashimoto et al, A 20–ns 256K×4 Fifo Memory, vol. 23, No. 2, pp. 490–499, Apr. 1988.

*IEEE 1987 Custom Integrated Circuits Conference*, I. Nakagawa et al, "A 1 Mb Field Memory For TV Pictures," pp. 319–322, 1987.

\* cited by examiner

SYNCHRONOUS DYNAMIC RANDOM ACCESS MEMORY AND DATA PROCESSING SYSTEM USING AN ADDRESS SELECT SIGNAL

CROSS-REFERENCE TO RELATED APPLICATIONS

This application is a Continuation of application Ser. No. 07/783,436, filed Oct. 24, 1991, now abandoned.

U.S. patent application Ser. No. 07/690,207 (TI Case No. TI-15876), filed Apr. 23, 1991, now abandoned in favor of continuation U.S. patent application Ser. No. 08/184,749, filed Jan. 21, 1994, now U.S. Pat. No. 5,390,149, is hereby incorporated by reference.

FIELD OF THE INVENTION

This invention relates to a dynamic random access memory (DRAM) arranged for operating in a data processing system.

BACKGROUND OF THE INVENTION

In the past, semiconductor dynamic random access memory operated faster than the associated microprocessor. During the late 1970's and early 1980's, the microcomputer market was in the early stages of development. At that time, a microcomputer system included a microprocessor and a dynamic random access memory. In a microcomputer arrangement, the microprocessor ran synchronously in response to a clock signal, but the dynamic random access memory ran asynchronously with respect to the operation of the microprocessor. The microprocessor clock was applied to a controller circuit that was interposed between the microprocessor and the dynamic random access memory. In response to the microprocessor clock signal, the controller derived other control or clock signals which ran the dynamic random access memory operation.

Typical operating speeds of the microprocessor and the dynamic random access memory were different from each other. A microprocessor cycle time was in a range of 400–500 nanoseconds while a dynamic random access memory cycle time was approximately 300 nanoseconds. Thus the dynamic random access memory was able to operate faster than its associated microprocessor. The memory completed all of its tasks with time to spare. As a result, the microprocessor operated at its optimum speed without waiting for the memory to write-in data or read out data.

Subsequently, as the semiconductor art developed, the operating speeds of microprocessors and memory devices have increased. Microprocessor speeds, however, have increased faster than dynamic random access memory speeds. Now microprocessors operate faster than their associated dynamic random access memory. For instance, a microprocessor cycle time is approximately 40 nanoseconds and a dynamic random access memory cycle time is approximately 120 nanoseconds. The microprocessor completes all of its tasks but must wait significant periods of time for the dynamic random access memory.

Having the microprocessor waiting for the memory is a problem that has been attracting the attention of many microcomputer designers. High speed static cache memories have been added to the microcomputer systems to speed up access to data stored in the memory. A significant part of the problem is to speed up access to data in the memory without significantly increasing the cost of the microcomputer system. Cache memory, however, is significantly more expensive than dynamic random access memory.

An existing problem with dynamic random access memory devices is that they require a substantial amount of peripheral circuitry between the microprocessor and the memory for generating several control signals. So many interdependent control signals are generated by long logic chains within the peripheral circuitry that microcomputer systems designers must resolve very complex timing problems. The delay caused by the timing problems and the fact that memories now are accessed slower than the associated microprocessor cause problems of excessive time delays in microcomputer system operations.

In addition to the foregoing problems, the prior art arrangements, such as described in U.S. Pat. No. 5,390,149, include many control leads between the microprocessor and the dynamic random access memory. Those control leads include several chip-to-chip interconnections. Generally, integrated circuit designers desire to reduce the number of off-chip leads from a device. Thus, there is a problem in actually reducing the number of off-chip leads between the microprocessor and the dynamic random access memory.

SUMMARY OF THE INVENTION

These and other problems are solved by a digital processor and a system clock circuit for producing a system clock signal having timing edges for controlling operation of the digital processor. A synchronous random access memory, directly responsive to the edges of the system clock signal and an address select signal, is arranged for accessing addressable storage cells within the synchronous dynamic random access memory to write data into the storage cells or read data out from the storage cells. RAS and CAS control signals are not required because row and column address timing is initiated by the single address select signal. This synchronous random access memory device may be fabricated as a dynamic or as a static storage device.

BRIEF DESCRIPTION OF THE DRAWINGS

A better understanding of the invention may be derived by reading the following detailed description with reference to the drawings wherein.

DETAILED DESCRIPTION

Figure 1:
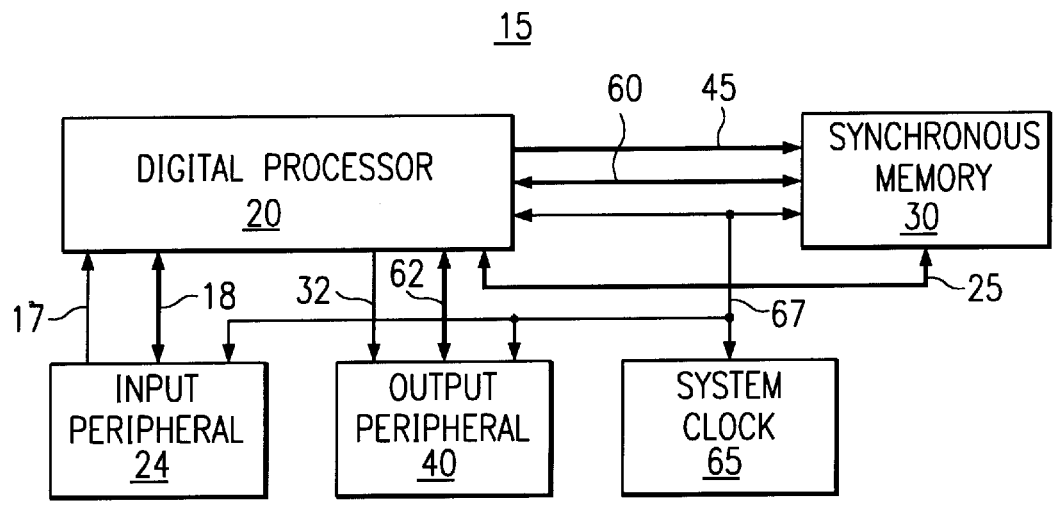
FIG. 1 is a block diagram of a data processing system including a synchronous dynamic random access memory.

Referring now to FIG. 1, a data processing system 15 includes a digital processor 20 which receives digital data by way of a bus 17 from an input peripheral device 24. The digital processor 20 may be a microprocessor. Control signals pass between the digital processor 20 and the input peripheral device 24 by way of a control bus 18. The digital processor 20 processes that data and other data, all of which may be transmitted by way of a data bus 25 for storage in and retrieval from a synchronous memory device 30. The digital processor 20 also sends resulting output data via an output data bus 32 to an output peripheral device 40 where the output data may be displayed or used for reading, viewing or controlling another device that is not shown. Control signals are transmitted between the digital processor 20 and the synchronous memory device 30 by way of a control bus 60. Control signals also are transmitted between the digital processor 20 and the output peripheral device 40 by way of a control bus 62. System clock signals are produced by a system clock device 65 and are applied through a clock lead 67 to the digital processor 20, the synchronous memory device 30, the input peripheral device 24, and the output peripheral device 40.

From time to time during operation of the data processing system 15, the digital processor 20 accesses the synchronous memory 30 for writing data into storage cells or for reading data from the storage cells thereof. Storage cell row and column addresses, generated by the digital processor 20, are applied through an address bus 45 to the synchronous memory 30. Data may be sent by way of the data bus 25 either from the digital processor 20 to be written into the synchronous memory 30 or to be read from the synchronous memory 30 to the digital processor 20.

Control signals, produced by the digital processor 20 and transmitted by way of the control bus 60 to the synchronous memory 30 include an address select signal $\overline{ADS}$, a write signal $\overline{WE}$, a burst select signal $\overline{BT}$, a burst direction signal +/−, a wrap select signal $\overline{WP}$, a wrap-type signal WT, a wrap-length signal WL, and others. Control signals may also be transmitted by way of the control bus 60 from the synchronous memory 30 to the digital processor 20.

Figure 2:
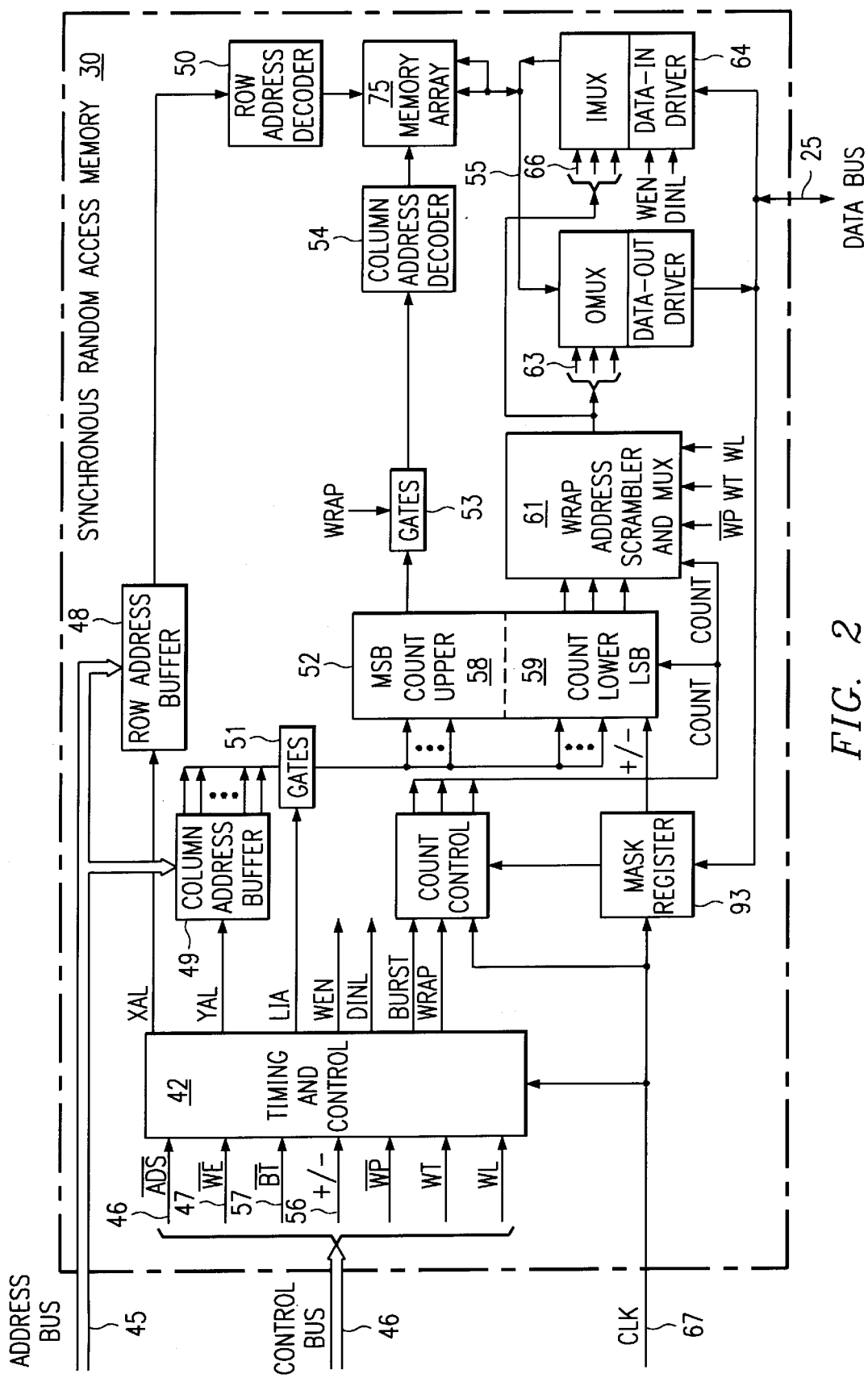
FIG. 2 is a block diagram of a synchronous random access memory.

Referring now to FIG. 2, the synchronous random access memory 30 includes a memory array 75 of metal-oxide-semiconductor (MOS) dynamic storage cells arranged in addressable rows and columns. The memory array 75 of storage cells is similar to the well known arrays of cells used in dynamic random access memory devices. Either complementary metal-oxide-semiconductor (CMOS) or bipolar complementary metal-oxide-semiconductor (BICMOS) technology may be used for fabricating the memory array 75.

Several other circuit blocks including timing and control circuit 42, row address buffer 48, column address buffer 49, row address decoder 50, transfer gates 51 and 53, column address counter 52, column address decoder 54, wrap address scrambler and multiplexer (MUX) 61, output multiplexer (OMUX) and data-out driver, input multiplexer (IMUX) and data-in driver, mask register 93, and count control circuit 94 are shown in FIG. 2. These other circuit blocks are designed and arranged for operating the array of storage cells synchronously with the digital processor 20 of FIG. 1 in response to the common system clock signal CLK. The circuit blocks other than the array of storage cells may be fabricated as either CMOS or BICMOS circuits.

The synchronous random access memory 30 is operable for synchronous random access read or write operations, for synchronous burst read or write operations, and for synchronous wrap read or write operations. Several types of synchronous operations are to be described herein with reference to timing diagrams. In the timing diagrams, a DON'T CARE state is represented by cross-hatching.

Figure 3:
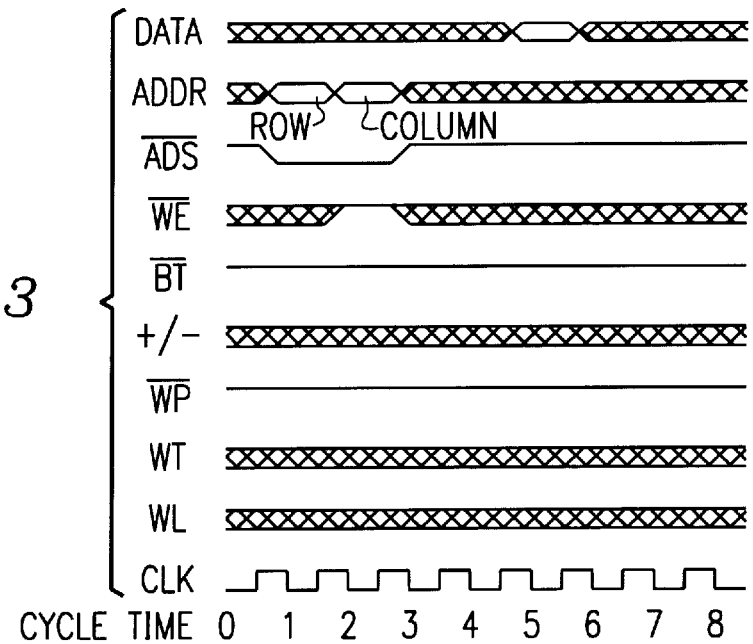
FIG. 3 is a timing diagram of a synchronous random access read operation.

Referring now to FIGS. 2 and 3 for a synchronous random access read operation, an N bit wide row address and the address select signal $\overline{ADS}$ are applied to the address bus 45 and a lead 46 of the control bus 60. Control signals, such as the signal $\overline{ADS}$ and others including a write signal $\overline{WE}$, a burst select signal $\overline{BT}$, and a wrap select signal $\overline{WP}$, are active low signals. The write signal $\overline{WE}$ on a lead 47 of the control bus 60 being high, at clock cycle time 2, designates a read operation. The synchronous read operation commences at a falling edge of the system clock signal CLK at clock cycle time 1. For this illustrative embodiment, the system clock times operations in synchronism at the negative-going edges of the clock pulses, such as at the clock cycle times 1, 2, 3, etc. In other embodiments, not shown herein, the system may time operations at the positive-going edges or on both negative-going and positive-going edges of the clock pulses.

When the system clock CLK has a negative-going edge while the row address is applied at the clock cycle time 1 and the address select signal $\overline{ADS}$ is low, the row address is latched into the row address buffer 48.

Since the illustrative embodiment has an N bit wide address bus, that bus is time shared by row addresses and column addresses. During the clock cycle time 2 following the latching of the row address into the row address buffer 48, a column address is applied to the address bus 45 and is latched into the column address buffer 49. During the clock cycle time 2, the address select signal $\overline{ADS}$ and the clock signal latch the column address into the column address buffer 49 in this multiplexed address system.

Concurrently with the latching of the column address into the column address buffer, the row address is being decoded through the row address decoder 50. The row address decoder 50 decodes the binary number row address into a one-out-of-$2^N$ selection. As a result of the one-out-of-$2^N$ selection, an active signal is applied to the wordline of the one selected row. This wordline remains selected throughout the remainder of the random access read operation.

At the next negative-going edge of the system clock CLK, a load initial address signal LIA enables a group of load count transfer gates 51 to move the initial column address into upper count and lower count sections of a column address counter 52. The most significant bits of the column address are latched into the upper count section 58 and the least significant bits of the column address are latched into the lower count section 59 of the column address counter 52. All of those address bits in the column address counter 52 represent the initial column address to be applied to the memory array for the read out operation. Since the operation being described is a synchronous random access operation, the initial column address is the only column address to be applied to the memory array during the read operation.

The most significant bits of the initial column address are applied from the upper count section 58 through gate 53 to the column address decoder 54 for selecting M columns of storage cells of the memory array, from which data are to be read out. These most significant bits of the column address are decoded by the column address decoder 54 to enable a block of M columns of storage cells in the memory array 75.

Data bits are read from a group of M storage cells, determined by a part of the decoded column address, i.e., the decoded most significant bits of the column address. These M data bits are transferred in parallel from the memory array 75 through a group of leads 55 to an output multiplexer OMUX where they are latched for output during the clock cycle time 4.

A one-out-of-M selection is made by the output multiplexer OMUX in response to control signals applied to the output multiplexer from the lower count section 59 of the column address counter 52. The least significant bits of the initial column address, residing in the lower count section 59, determine which bit latched in the output multiplexer OMUX is the one-out-of-M bit to be gated through the output multiplexer to a lead in the data bus 25.

A more complete description of the column address counter 52 and of the output multiplexer can be found in the U.S. Pat. No. 5,390,149, mentioned previously and incorporated herein by reference.

Figure 4:
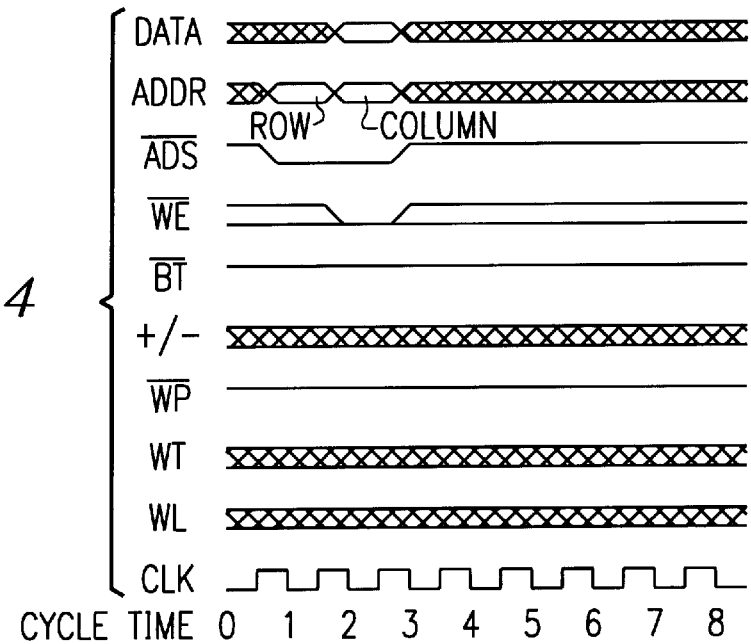
FIG. 4 is a timing diagram of a synchronous random access write operation.

Referring now to FIGS. 2 and 4 for a synchronous random access write operation, row addressing and column addressing occur similar to the synchronous random access read operation except that the write signal $\overline{\text{WE}}$ is at a low level at the clock cycle time 2 to designate the synchronous random access write operation. The decoded row address from the row decoder 50 enables one row of storage cells in the memory array 75. The most significant bits of the column address, decoded by the column decoder 54, enable a block of M column leads in the array. The selected set of storage cells at the addressed intersections of the addressed row and the set of M addressed columns are enabled to receive the data that is to be written. The least significant bits of the column address (residing in the lower count section 59 of the column address counter 52) determine control signals that are applied to the input multiplexer IMUX for determining which one-out-of-M bit on the data bus 25 is transmitted through the input multiplexer IMUX to be written into the memory array 75. The one-out-of-M bit is applied to the associated column lead of the selected block of columns of storage cells in the memory array 75. That bit of data is written into the storage cell at the address selected by the row address and the initial column address. The other M−1 bits of data, related to the selected set of M columns, are not written into the memory array 75 because the input multiplexer IMUX does not transmit those M−1 bits to the associated column lines of the memory array 75.

A more complete description of the input multiplexer IMUX can be found in the U.S. Pat. No. 5,390,149, mentioned previously.

The next subsequent operation of the memory array following either the synchronous read operation or the synchronous write operation may be another synchronous random access operation, i.e., either a synchronous read operation or a synchronous write operation. The same row and column addresses or a different row or column address can be used to select the storage cell for the next access. A synchronous burst or a synchronous wrap operation also may follow the synchronous random access read or write operations.

In the foregoing discussion of the synchronous read and write operations, the illustrative embodiment includes an N bit wide address bus 45 that is time-shared by row and column addresses. In another useful embodiment, not shown, the address bus may be wide enough so that both the row and column addresses are applied concurrently in parallel. As a result, both addresses are latched simultaneously into their respective address buffers, i.e., row address buffer 48 and column address buffer 49 when the address select signal $\overline{\text{ADS}}$ is low when the system clock CLK goes low. Otherwise the synchronous random access read and write operations proceed, as previously described.

It is noted that for the synchronous random access write operations, the row and column addresses may be latched either before data is latched or at the same time.

In addition to the synchronous random access read and write operations, the embodiment of FIGS. 1 and 2 can perform a synchronous burst read operation and a synchronous burst write operation.

In the synchronous burst read operation, a group of bits is read rapidly from a sequence of column addresses along a common row of storage cells in the memory array 75. The sequence of addresses can be either in an ascending order of column addresses (UP) or in a descending order of column addresses (DOWN). The direction, or polarity, of the sequence of column addresses is determined by a burst direction signal +/− on a lead 56 of the control bus 60. The length of the burst, i.e., the number of bits in the burst, is determined by the duration of the low burst select signal $\overline{\text{BT}}$ that is applied, on a lead 57 of the control bus 60, by the digital processor 20 of FIG. 1. When the burst select signal $\overline{\text{BT}}$ goes high, the synchronous burst read operation is terminated.

Generally synchronous burst read and write operations and synchronous wrap read and write operations are similar to random access read and write operations. There are some differences. Except for the manner in which addresses are latched into the address buffers, a synchronous operation (either a synchronous burst read, a synchronous burst write operation, a synchronous wrap read operation, or a synchronous wrap write operation) of the synchronous memory device 30 of FIG. 2 is accomplished in a manner which is similar to the operation described in the aforementioned U.S. Pat. No. 5,390,149. The upper count section 58 and the lower count section 59 of the column address counter 52 operate as described in the aforementioned patent application.

In FIG. 2, the mask register 93 receives and stores coded mask data from the data bus 25. Responsive to the system clock signal CLK, the mask register 93 applies the mask data to control the operation of the count control circuit 94.

Count control circuit 94, in response to the status of the burst control signal BURST, the wrap control signal WRAP, the mask data, and the system clock CLK, produces the clock signal COUNT for controlling the operation of the column address counter 52 and the wrap address scrambler and multiplexer 61.

Timing and control circuit 42 of FIG. 2 is responsive to the address select signal $\overline{\text{ADS}}$, the write signal $\overline{\text{WE}}$, the burst select signal $\overline{\text{BT}}$, the burst direction signal +/−, the wrap select signal $\overline{\text{WP}}$, the wrap-type signal WT, the wrap-length signal WL, and the system clock signal CLK for producing control signals, such as, the row and column address latching signals XAL and YAL, the load initial address signal LIA, the write enable signal WEN, the data-in latch signal DINL, the burst control signal BURST, and the wrap control signal WRAP.

In the timing and control circuit 42 of FIG. 2, all of the signals from the control bus 60 are gated by the system clock signal CLK on lead 67 so that all control signals internal to the synchronous random access memory 30, such as, the signals XAL, YAL, LIA, WEN, DINL, BURST and WRAP are synchronized with the system clock signal CLK. This feature assures that the functions of the synchronous random access are synchronized with that clock. Any logic circuitry external to the synchronous random access memory 30 need not be concerned with any complex timing relationships between the various signals transmitted on the control bus 60.

Figure 5:
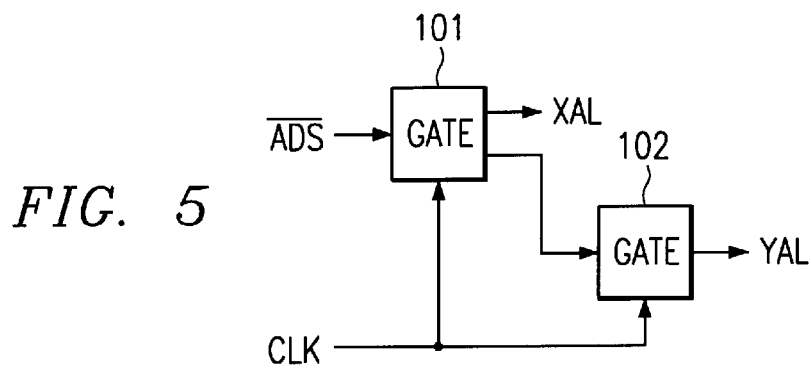
FIG. 5 is a logic schematic diagram of a timing gate circuit.

Referring now to FIG. 5, there are shown two exemplary gates 101 and 102 of the timing and control circuit 42 of FIG. 2. In gate 101, the address select signal $\overline{\text{ADS}}$ is gated by the system clock signal CLK, i.e., sampled on the negative-going edge of the pulses of the system clock signal CLK. The resulting output of the gate 101 is the row address latch signal XAL. In the gate 102, the output of gate 101 also is gated by the system clock signal CLK. The resulting output of the gate 102 is the column address latch signal YAL.

Figure 6:
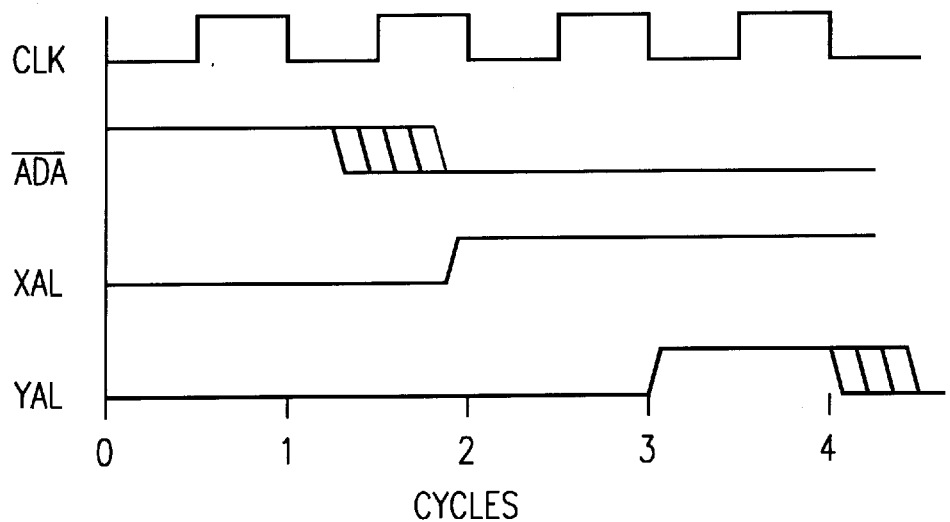
FIG. 6 is a timing diagram for the operation of the gate circuit of FIG. 5.

FIG. 6 is a timing diagram for the operation of the gates 101 and 102. As shown in FIG. 6, the row address latch signal XAL is activated by the negative-going edge of the system clock CLK at the system clock cycle time 2 when the address select signal $\overline{\text{ADS}}$ is low. The column address latch signal YAL is activated by the negative-going edge of the system clock CLK one clock cycle later, i.e., at system clock cycle time 3 when the address select signal $\overline{ADS}$ is low. The timing of the negative-going edge of the address select signal $\overline{ADS}$ is irrelevant, as long as the level of that signal is low at the negative-going edge of the system clock signal CLK.

Similarly, all of the other internal control signals are responsive to sampled levels of the external control signals on the control bus 60 at times of the negative-going edges of the system clock signal CLK.

The foregoing describes data processing system arrangements which represent illustrative embodiments of the invention. Those embodiments and others made obvious in view thereof are considered to fall within the scope of the appended claims.

What is claimed is:

1. A method for accessing a synchronous dynamic random access memory comprising the steps of:
   a) directly applying a system clock signal to the synchronous dynamic random access memory, the synchronous dynamic random access memory including an array of storage cells;
   b) addressing a row and a column of storage cells in the array of storage cells in response to a single select signal and the system clock signal; and
   c) in synchronism with the system clock signal, accessing an addressed storage cell for writing data into or reading data out of the addressed storage cell.

2. A data processing system comprising:
   a digital processor;
   a system clock circuit for producing a system clock signal having timing edges for controlling operation of the digital processor; and
   a synchronous random access memory directly responsive to the edges of the system clock signal in concert with row and column address signals and a single select signal for accessing addressable storage cells within the synchronous random access memory to write data into the storage cells and to read out data from the storage cells.

3. A data processing system, in accordance with claim 2, further comprising:
   a timing and control circuit, directly responsive to the edges of the system clock signal and the single select signal, for producing memory control signals synchronized with the system clock signal to control addressing of rows and columns of the synchronous random access memory for write-in or readout operations.

4. A data processing system, in accordance with claim 3, wherein
   the synchronous random access memory is fabricated as a metal oxide semiconductor device having an array of static storage cells.

5. A data processing system, in accordance with claim 3, wherein
   the synchronous random access memory is fabricated as a metal oxide semiconductor device having an array of dynamic storage cells.

6. A data processing system, in accordance with claim 3, wherein
   the digital processor produces control signals that are applied directly to the timing and control circuit together with the system clock signal for controlling generation of synchronous random access memory control signals.

7. A data processing system, in accordance with claim 5, wherein
   the array of dynamic storage cells is fabricated as complementary metal oxide semiconductor circuits.

8. A data processing system, in accordance with claim 5 wherein
   the array of dynamic storage cells is fabricated as bipolar complementary metal oxide semiconductor circuits.

9. A synchronous random access memory comprising:
   an array of storage cells arranged in addressable rows and columns;
   a row address buffer;
   a row address decoder;
   a column address buffer;
   a column address decoder; and
   control circuitry, directly responsive to edges of a system clock signal and to a single select signal, for enabling row address data to be stored in the row address buffer for decoding through the row address decoder and for enabling column address data to be stored in the column address buffer for decoding in the column address decoder.

10. A synchronous random access memory, in accordance with claim 9, wherein
    the array of storage cells is fabricated as an array of static memory circuits.

11. A synchronous random access memory, in accordance with claim 10, wherein
    the array of storage cells is fabricated as a metal oxide semiconductor device.

12. A synchronous random access memory, in accordance with claim 11, wherein
    the array of storage cells comprises complementary metal oxide semiconductor circuits.

13. A synchronous random access memory, in accordance with claim 9, wherein
    the array of storage cells comprises bipolar complementary metal oxide semiconductor circuits.

14. A synchronous random access memory, in accordance with claim 9, wherein
    the array of storage cells is fabricated as an array of dynamic memory circuits.

15. A synchronous random access memory, in accordance with claim 14, wherein
    the array of storage cells is fabricated as a metal oxide semiconductor device.

16. A synchronous random access memory, in accordance with claim 15, wherein
    the array of storage cells comprises complementary metal oxide semiconductor circuits.

17. A synchronous random access memory, in accordance with claim 9, wherein
    the edges of the system clock signal are falling edges.

18. A synchronous random access memory, in accordance with claim 9, wherein
    the edges of the system clock signal are rising edges.

19. A synchronous random access memory, in accordance with claim 9, wherein
    the edges of the system clock signal are rising and falling edges.

20. A data processing system, in accordance with claim 2, wherein
    the edges of the system clock signal are falling edges.

21. A data processing system, in accordance with claim 2, wherein
    the edges of the system clock signal are rising edges.

22. A data processing system, in accordance with claim 2, wherein
    the edges of the system clock signal are rising and falling edges.

* * * * *